(12) United States Patent
Cheng (10) Patent No.: US 12,348,241 B2
(45) Date of Patent: Jul. 1, 2025

(54) SUCCESSIVE APPROXIMATION ANALOG-TO-DIGITAL CONVERTER, ANALOG-TO-DIGITAL CONVERSION METHOD AND DEVICE APPLYING IN THE SAME

(71) Applicant: Joulwatt Technology Co., Ltd., Hangzhou (CN)

(72) Inventor: Yang Cheng, Hangzhou (CN)

(73) Assignee: Joulwatt Technology Co., Ltd., Hangzhou (CN)

( * ) Notice: Subject to any disclaimer, the term of this patent is extended or adjusted under 35 U.S.C. 154(b) by 272 days.

(21) Appl. No.: 18/129,100

(22) Filed: Mar. 31, 2023

(65) Prior Publication Data

US 2023/0318616 A1     Oct. 5, 2023

(30) Foreign Application Priority Data

Mar. 31, 2022   (CN) .......................... 202210343099.X (51) Int. Cl.
*H03M 1/38*     (2006.01)
*H03M 1/46*     (2006.01)

(52) U.S. Cl.
CPC .................................. *H03M 1/466* (2013.01)

(58) Field of Classification Search
CPC .................................................... H03M 1/466
USPC ................. 341/155, 144, 153, 161, 118, 120
See application file for complete search history.

(56) References Cited

U.S. PATENT DOCUMENTS

| | | | |
|---|---|---|---|
| 8,319,673 B2 * | 11/2012 | Steensgaard-Madsen | ................... H03M 1/18 341/131 |
| 2006/0232461 A1 * | 10/2006 | Felder | ................... H03M 1/462 341/161 |
| 2013/0285843 A1 * | 10/2013 | Lin | ........................ H03M 1/144 341/110 |
| 2019/0140654 A1 * | 5/2019 | Huang | ................... H03M 1/125 |
| 2021/0184629 A1 * | 6/2021 | Hu | ............................ H03F 3/21 |
| 2023/0336184 A1 * | 10/2023 | Huang | ................ H03M 1/0692 |

\* cited by examiner

*Primary Examiner* — Peguy Jean Pierre
(74) *Attorney, Agent, or Firm* — Bayramoglu Law Offices LLC (57) ABSTRACT

An analog-to-digital converter includes a D/A conversion circuit, a comparator, and a logic control module. An input signal is sampled and held to obtain a sampling signal. The D/A conversion circuit receives the sampling signal and a reference voltage signal, and an output terminal of the D/A conversion circuit outputs a first voltage signal. The output terminal of the D/A conversion circuit is coupled to at least one input terminal of the comparator. An output terminal of the comparator is coupled to an input terminal of the logic control module, and the logic control module controls the D/A conversion circuit to adjust the first voltage signal according to a comparison result of the comparator. When the number of comparisons of the comparator reaches preset digits of the D/A conversion circuit, a data output terminal of the logic control module outputs a data signal corresponding to the input signal.

19 Claims, 4 Drawing Sheets

SUCCESSIVE APPROXIMATION ANALOG-TO-DIGITAL CONVERTER, ANALOG-TO-DIGITAL CONVERSION METHOD AND DEVICE APPLYING IN THE SAME

CROSS REFERENCE TO THE RELATED APPLICATIONS

This application is based upon and claims priority to Chinese Patent Application No. 202210343099.X, filed on Mar. 31, 2022, the entire contents of which are incorporated herein by reference.

TECHNICAL FIELD

The present invention relates to the field of power electronics, more particularly, to a successive approximation analog-to-digital converter, an analog-to-digital conversion method, and a device applying the same.

BACKGROUND

Successive Approximation (SAR) ADC is a widely used ADC; with the continuing progress of technology, the speed and precision of the ADC are also advancing, and the area of chips is also becoming smaller and smaller. However, with the expansion of application demands, there are further requirements for the precision and conversion speed of the ADC measurement.

The internal of the SARADC is mainly formed of three modules, namely, a DAC capacitor array, a comparator, and logic controls, wherein the DAC capacitor array module and the comparator decide the speed and precision of the entire ADC system. Therefore, in order to realize a high-speed and high-precision ADC, breakthrough and improvement are mainly made on the DAC and the comparator. The prior art comparator and the DAC capacitor array control need to rely on a correct common mode voltage; there is high requirement on the dynamic features of the common mode voltage for different input analog signals, which adds design difficulty, and also influences the DC accuracy of the ADC.

SUMMARY

In view of this, the objective of the present invention is to provide a successive approximation analog-to-digital converter, an analog-to-digital conversion method, and a device applying the same, so as to solve the problems of high difficulty in design and precision influence brought by the requirement for the common mode voltage in the prior art.

The present invention discloses a successive approximation analog-to-digital converter, wherein it comprises a D/A conversion circuit, a comparator, and a logic control module; an input signal is sampled and held to obtain a sampling signal; the D/A conversion circuit receives the sampling signal and a reference voltage signal, and its output terminal outputs the first voltage signal; the output terminal of the D/A conversion circuit is coupled to at least one input terminal of the comparator; the output terminal of the comparator is coupled to the input terminal of the logic control module, and the logic control module controls the D/A conversion circuit to adjust the first voltage signal according to the comparison result of the comparator; when a number of comparisons of the comparator reaches preset digits of the D/A conversion circuit, the data output terminal of the logic control module outputs a data signal corresponding to the input signal.

Preferably, the D/A conversion circuit adjusts the first voltage signal up or down according to the comparison result.

Preferably, the D/A conversion circuit comprises a unit capacitor and a capacitor array; a first terminal of the unit capacitor is connected to a reference ground terminal or to a connection terminal of the reference voltage signal through a single-pole double-throw switch; the capacitor array comprises a plurality of capacitor banks, each capacitor bank comprising two capacitors with an equal capacitance value, and a first terminal of each capacitor in the capacitor array is switched to the reference ground terminal or to the connection terminal of the reference voltage signal through the single-pole double-throw switch connected in serial with the capacitor; at the initial moment, the first terminal of one capacitor in each capacitor bank is connected to the connection terminal of the reference voltage signal through the single-pole double-throw switch, and the first terminal of the other capacitor is connected to the reference ground terminal through the single-pole double-throw switch; the unit capacitor and the second terminal of the capacitor array are connected together, and their common connection terminal is used as the output terminal of the D/A conversion circuit.

Preferably, capacitance value of the unit capacitor is used as the unit capacitance value, and each group of capacitance values of the plurality of capacitor banks are arranged in a binary or thermometer code manner based on the unit capacitance value.

Preferably, wherein the reference ground terminal or the connection terminal of the reference voltage signal is switched starting from the capacitor bank with the largest capacitance value according to the comparison result of the comparator.

Preferably, before the comparator performs the comparison, the sampling signal is transmitted to the first input terminal of the comparator and the common connection terminal; a second input terminal of the comparator is connected to the reference ground terminal, and the comparator performs a first comparison according to the sampling signal and the voltage of the reference ground terminal.

Preferably, the D/A conversion circuit comprises a second switch, the first terminal of the second switch receives the sampling signal, and the second terminal of the second switch is connected to the common connection terminal, the second switch is turned on before the comparator performs the comparison, and the sampling signal is transmitted to the first input terminal of the comparator and the second terminals of the unit capacitor and the capacitor array; after that, the second switch is turned off, and the comparator performs the first comparison according to the sampling signal and the signal of the reference ground terminal.

Preferably, the successive approximation analog-to-digital converter comprises a first switch, the first terminal of the first switch receives the sampling signal, the second terminal of the first switch and the output terminal of the D/A conversion circuit are connected to the same node, and the node is coupled to the first input terminal of the comparator; before the comparator performs the comparison, the first switch is turned on, and the sampling signal is transmitted to the first input terminal of the comparator and the second terminals of the unit capacitor and the capacitor array, after that the first switch is turned off, and the comparator performs the first comparison according to the sampling signal and the signal of the reference ground terminal.

Preferably, a range value of the successive approximation analog-to-digital converter is consistent with a value of the reference voltage signal, and the scope of the range value of the successive approximation analog-to-digital converter is from subtracting one half of the voltage of the reference voltage signal from the voltage of the reference ground terminal to adding one half of the reference voltage signal to the voltage of the reference ground terminal.

Preferably, the voltage of the reference ground terminal is zero voltage.

Preferably, the sampling signal comprises a first sampling signal and a second sampling signal, before the comparator performs the comparison, the first sampling signal and the second sampling signal are respectively transmitted to the first input terminal and the second input terminal of the comparator; the comparator performs the first comparison according to the first sampling signal and the second sampling signal; the D/A conversion circuit comprises two sub D/A conversion circuits to receive the first sampling signal and the second sampling signal respectively and output the first voltage signal and the second voltage signal, and the first voltage signal and the second voltage signal are respectively transmitted to the first input terminal and the second input terminal of the comparator.

Preferably, the circuit structures of the two sub D/A conversion circuits are the same, and each sub D/A conversion circuit comprises a third switch, the first terminals of the two third switches respectively receive the first sampling signal and the second sampling signal, the second terminals of the two third switches are correspondingly connected to the common connection terminal of the D/A conversion circuit; before the comparator performs the comparison, the third switch is turned on, and the first sampling signal and the second sampling signal are transmitted to the two input terminal of the comparator, and the first sampling signal and the second sampling signal are correspondingly transmitted to the second terminals of the unit capacitor and the capacitor array of the D/A conversion circuit, after that, the two third switches are turned off, and the comparator performs the first comparison according to the first sampling signal and the second sampling signal.

Preferably, the circuit structures of the two sub D/A conversion circuits are the same, and the successive approximation analog-to-digital converter comprises a fourth switch and a fifth switch; the first terminal of the fourth switch receives the first sampling signal, and the second terminal of the fourth switch and the output terminal of one sub D/A conversion circuit of the D/A conversion circuit are connected to the same node, the node being coupled to the first input terminal of the comparator; the first terminal of the fifth switch receives the second sampling signal, the second terminal of the fifth switch and the output terminal of another sub D/A conversion circuit of the D/A conversion circuit are connected to the same node, the node being coupled to the second input terminal of the comparator; before the comparator performs the comparison, the fourth and the fifth switches are turned on, the first sampling signal and the second sampling signal are transmitted to the first input terminal and the second input terminal of the comparator, after that, the fourth switch and the fifth switch are turned off, the comparator performs the first comparison according to the first sampling signal and the second sampling signal.

Preferably, a range value of the successive approximation analog-to-digital converter is consistent with a value of the reference voltage signal, and the scope of the range value of the successive approximation analog-to-digital converter is from negative ½ to positive ½ of the value of the reference voltage signal.

In the second aspect, the present invention provides a device, which comprises the above successive approximation analog-to-digital converter and a processor; the processor is coupled to the data output terminal of the successive approximation analog-to-digital converter to receive the data signal, and the processor performs logic calculation on the data signal to transmit it to subsequent stages of circuits to perform applications.

In a third aspect, the present invention provides a successive approximation analog-to-digital conversion method, wherein comprising: the input signal is sampled and held to obtain a sampling signal; receiving the sampling signal and the reference voltage signal by the D/A conversion circuit, outputting the first voltage signal, the first voltage signal is transmitted to an input terminal of the comparator, and the comparison result of the comparator is received by the logic control module to control the D/A conversion circuit to perform adjustment on the first voltage signal; when a number of comparison of the comparator achieves the preset digits of the D/A conversion circuit, the data output terminal of the logic control module outputs data signals corresponding to the input signal.

Preferably, the D/A conversion circuit adjusts the first voltage signal up or down according to the comparison result.

Preferably, the first voltage signal is obtained by addition or subtraction of the sampling signal and the reference voltage signal.

Preferably, the D/A conversion circuit comprises a capacitor array formed of a unit capacitor and a plurality of capacitor banks, each capacitor bank comprising two capacitors with an equal capacitance value; the first terminals of the unit capacitor and each capacitor of the capacitor array are connected to the reference ground terminal or to the connection terminal of the reference voltage signal through a single-pole double-throw switch, the second terminal of the unit capacitor and each capacitor of the capacitor array are connected together as the output terminal of the D/A conversion circuit.

Preferably, the sampling signal is transmitted to the first input terminal of the comparator, the second input terminal of the comparator is connected to the reference ground terminal, and the comparator performs the first comparison according to the sampling signal and the voltage of the reference ground terminal; the comparator performs the second and subsequent comparisons according to the first voltage signal and the voltage of the reference ground terminal.

Preferably, a range value of the successive approximation analog-to-digital converter is consistent with a value of the reference voltage signal, and the scope of the range value of the successive approximation analog-to-digital converter is from subtracting one half of the voltage of the reference voltage signal from the voltage of the reference ground terminal to adding one half of the reference voltage signal to the voltage of the reference ground terminal.

Preferably, the sampling signal comprises a first sampling signal and a second sampling signal, before the comparator performs the comparison, the first sampling signal and the second sampling signal are respectively transmitted to the first input terminal and the second input terminal of the comparator; the comparator performs the first comparison according to the first sampling signal and the second sampling signal; the D/A conversion circuit comprises two sub D/A conversion circuits respectively receive the first sampling signal and the second sampling signal to output the first voltage signal and the second voltage signal, the first voltage signal and the second voltage signal are respectively transmitted to the first input terminal and the second input terminal of the comparator, the comparator performs the second and the subsequent comparisons according to the first voltage signal and the second voltage signal.

Preferably, a range value of the successive approximation analog-to-digital converter is consistent with a value of the reference voltage signal, and the scope of the range value of the successive approximation analog-to-digital converter is from negative ½ to positive ½ of the reference voltage signal.

By using the successive approximation analog-to-digital converter, the successive approximation analog-to-digital conversion method, and the device applying the same of the present invention, by optimizing the structure of the D/A converter and the comparator, the analog-to-digital converter of the present application does not need a common mode voltage, which reduces the design difficulty and enhances the device precision.

DETAILED DESCRIPTION OF THE EMBODIMENTS

The following will describe in great details the preferred embodiments of the present invention by combining with the accompanying drawings. However, the present invention is not restricted to these embodiments. The present invention covers any replacement, amendments, equivalent manners and solutions made within the spirits and scope of the present invention.

In order to make the public have a thorough understanding on the present invention, specific details are described in the following preferred embodiments of the present invention; however, those skilled in the art can totally understand the present invention without these details.

The present invention will be described more detailed by way of illustration by referring to the accompanying drawings in the following paragraphs. It needs to explain that the accompanying drawings all use simplified forms and non-accurate ratios, and are just for helping to describe the embodiments of the present invention conveniently and clearly.

Figure 1:
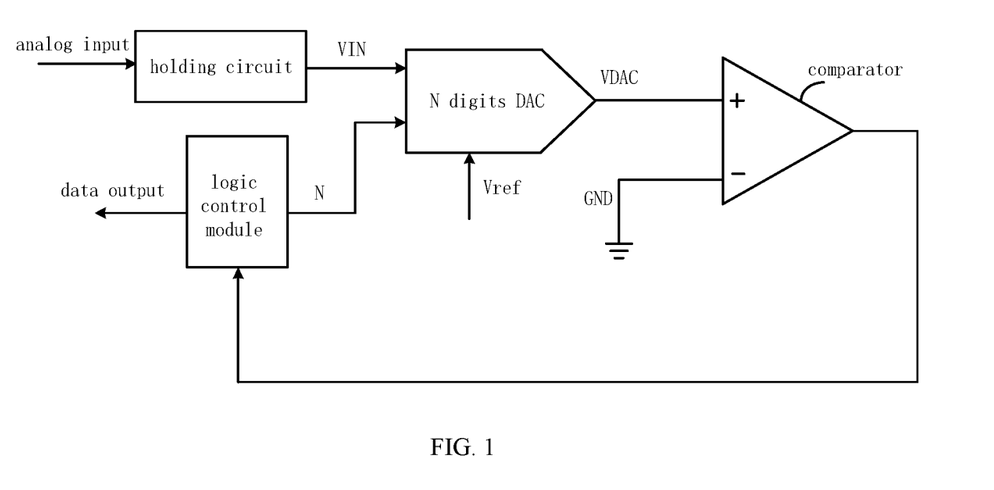
FIG. 1 is a schematic block diagram of a first embodiment of a successive approximation analog-to-digital converter of the present invention.
Figure 4:
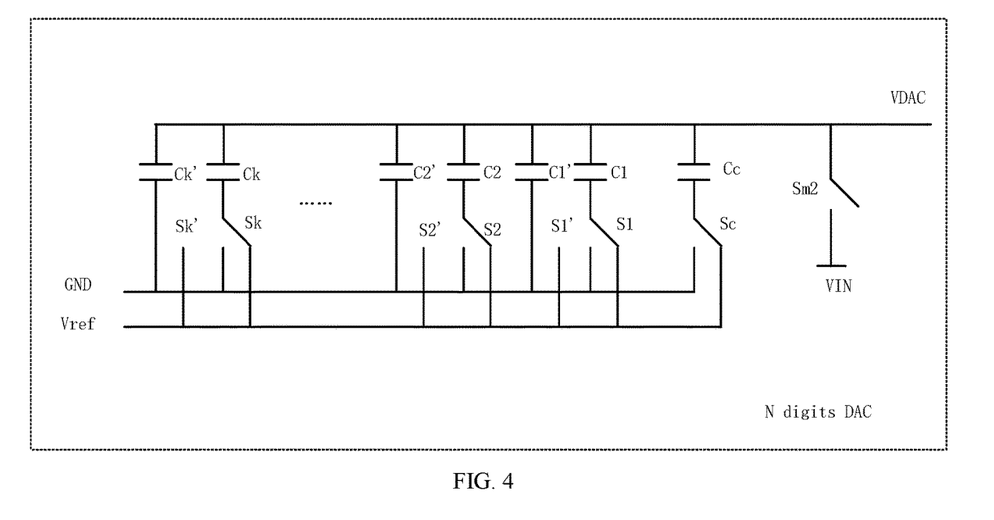
FIG. 4 is a D/A conversion circuit in the first embodiment of the present invention.

Refer to FIG. 1, it is a schematic block diagram of a first embodiment of a successive approximation analog-to-digital converter of the present invention, and FIG. 4 is the D/A conversion circuit in the first embodiment of the present invention. The successive approximation analog-to-digital converter of the embodiment of the present application comprises a D/A conversion circuit, a comparator, and a logic control module; an input signal is sampled and held to obtain a sampling signal; the D/A conversion circuit receives the sampling signal and a reference voltage signal, and its output terminal outputs a first voltage signal; the output terminal of the D/A conversion circuit is coupled to at least one input terminal of the comparator; in this embodiment, before the comparator performs the comparison, the sampling signal is transmitted to the first input terminal, e.g., a positive input terminal; here, the comparator performs the first comparison according to the sampling signal and the signal of the reference ground terminal; the first input terminal of the D/A conversion circuit is coupled to the feedback output terminal of the logic control module, and the output terminal of the D/A conversion circuit is also coupled to the first input terminal of the comparator, e.g., the positive input terminal; the D/A conversion circuit receives the reference voltage signal Vref, and its output terminal outputs the first voltage signal $V_{DAC}$; the second input terminal of the comparator, e.g., the negative input terminal, is connected to the ground terminal GND, and the output terminal of the comparator is coupled to the input terminal of the logic control module, and the logic control module controls the D/A conversion circuit to perform the regulation of the first voltage signal $V_{DAC}$ according to the comparison result of the comparator.

As shown in FIG. 1, the input signal may be an analog input signal or an input voltage; the input signal is processed by a sampling and holding circuit to obtain a sampling signal VIN, and the sampling and holding circuit may be a circuit structure formed of a switch and a capacitor, e.g., the prior art switch capacitor circuit. In the embodiment of the present application, when a number of comparison of the comparator achieves the preset digits of the D/A conversion circuit, the data output terminal of the logic control module outputs data signal corresponding to the input signal. For example, the number digit of D/A is 10 bits, then the comparator makes the comparison ten times, and each time a data is generated; the first comparison result corresponds to the highest digit; the second comparison result corresponds to the second-highest digit, and the last one corresponds to the lowest digit; each data is registered in the register of the logic control module; after 10 times of comparison, the generated ten datas are output as the output data of the analog-to-digital converter.

As shown in FIG. 4, the D/A conversion circuit in this embodiment comprises a unit capacitor and a capacitor array; the first terminal of the unit capacitor Cc is connected to the reference ground terminal or to the connection terminal of reference voltage signal through a single-pole double-throw switch (e.g., Sc); at the initial time, the first terminal of the unit capacitor is connected to the connection terminal of the reference voltage signal by a switch; the capacitor array comprises a plurality of capacitor banks, e.g., C1 and C1' form a capacitor bank, C2 and C2' form a capacitor bank, and Ck and Ck' form a capacitor bank; each capacitor bank comprises two capacitors with equal capacitance value; the first terminal of each capacitor in the capacitor array is switched to the ground terminal or to the connection terminal of the reference voltage signal through the single-pole double-throw switch; at the initial time, the first terminal of one capacitor in each capacitor bank is connected to the connection terminal of the reference voltage signal through the single-pole double-throw switch, and the first terminal of the other capacitor is connected to the reference ground terminal through the single-pole double-throw switch; the groups corresponding to the single-pole double-throw switch are like S1 and S1', S2 and S2', and SK and SK'. The second terminals of the unit capacitor and the capacitor array are connected together, and the common connection terminal is used as the output terminal of the D/A conversion circuit. In the embodiment shown in FIG. 3, the D/A conversion circuit comprises a second switch Sm2, and the first terminal of the second switch receives the sampling signal VIN, and the second terminal of the second switch is connected to the common connection terminal. Before the comparator performs the comparison, the second switch is turned on, and the sampling signal is transmitted to the first input terminal and the common connection terminal of the comparator; after that, the second switch is turned off, and the comparator performs the first comparison according to the sampling signal and the signal of the reference ground terminal. According to the above structure and FIG. 3, it can be obtained that the second terminal of the second switch and the common connection terminal of the unit capacitor and the capacitor array are connected to the same node, and the node is coupled to the first input terminal of the comparator; when the second switch is turned on, the sampling signal VIN is transmitted to the second terminal of the unit capacitor and the capacitor array, and the voltage of the second terminals of all capacitors is VIN, i.e., the magnitude of the first voltage signal initially outputted from the output terminal of the D/A conversion circuit is VIN.

In the embodiment of the present application, the capacitance value of the unit capacitor is used as the unit capacitance value, e.g., marked as capacitance value C, and each group of capacitance values of the plurality of capacitor banks are arranged in binary or thermometer code based on the unit capacitance value. For example, take the number of bits of D/A as 5 bit and binary as an example, the capacitance value of the first group of capacitor banks is 8C, the capacitance value of the second group of capacitor banks is 4C, the capacitance value of the third group of capacitor banks is 2C, the capacitance value of the fourth group of capacitor banks is C, and the capacitance value of the fifth group of capacitor banks is 0.5C.

In an embodiment, according to the comparison result of the comparator, the switching of the reference ground terminal or the connection terminal of the reference voltage signal is started from the capacitor bank with the greatest capacitance value. For example, when the comparator first compares the positive terminal voltage V+ and the negative terminal voltage, e.g., compares VIN and the zero voltage at the ground terminal, if V+ is greater than zero voltage, the comparator outputs the high level effective signal, and the signal output by the feedback output terminal of the logic control module controls the single-pole double-throw switch S1 to switch from the connection terminal of the reference voltage signal to the reference ground terminal; at this time, magnitude of the first voltage signal initially output from the output terminal of the D/A conversion circuit is VIN-8/32 Vref; if V+ is smaller than the zero voltage, the comparator outputs the low level invalid signal, and the signal output from the feedback output terminal of the logic control module controls the single-pole double-throw switch S1' to switch from the reference ground terminal to the connection terminal of the reference voltage signal; at this time, magnitude of the first voltage signal initially output from the output terminal of the D/A conversion circuit is VIN+8/32 Vref; after that, the comparator further compares according to the first voltage signal and the voltage of the reference ground terminal, and the D/A conversion circuit continues to regulate the magnitude of the first voltage signal by the above rules according to the comparison results.

From the above contents, it is known that the first voltage signal $V_{DAC}$ is obtained by addition or subtraction of the sampling signal VIN and the reference voltage signal Vref, and the D/A conversion circuit adjusts the first voltage signal up or down according to the comparison results. The first voltage signal in the embodiment of the present application can be scaled up and down, so the regulation is more flexible. In the condition of the same conversion number of bits of D/A, it can regulate the output data signal matching the input signal more accurately and with better precision.

In this embodiment, a range value of the successive approximation analog-to-digital converter is consistent with a value of the reference voltage signal, and the scope of the range value of the successive approximation analog-to-digital converter is from subtracting one half of the voltage of the reference voltage signal from the voltage of the reference ground terminal to adding one half of the reference voltage signal to the voltage of the reference ground terminal. If it is designed that the voltage value of the reference ground terminal is zero voltage, the signal value of the reference voltage is from negative ½ to positive ½, i.e., the range value is −½ Vref to ½ Vref, and an intermediate value of the range value of the successive approximation analog-to-digital converter is consistent with the voltage value of the reference ground terminal.

From the successive approximation analog-to-digital converter of the solutions of the present invention, first, a common mode voltage is not required, which reduces design difficulty and enhances device precision. Moreover, an input terminal of the comparator in the analog-to-digital converter of the present application, e.g., the negative input terminal, is connected to the reference ground terminal, and the voltage is fixed, and each time, it only needs to compare the input signal with the ground reference signal; the comparator only needs to be near the zero potential and with good accuracy, and it requires low on the width of the comparator; therefore, it can achieve the requirements on high accuracy when different signals are input.

Figure 2:
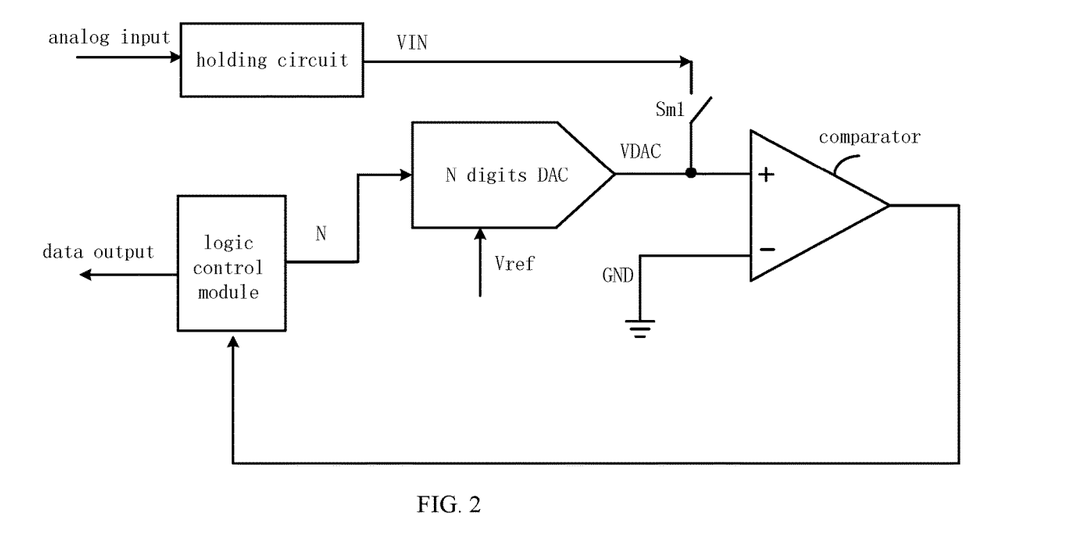
FIG. 2 is a schematic block diagram of a second embodiment of a successive approximation analog-to-digital converter of the present invention.

FIG. 2 is a schematic block diagram of a second embodiment of the successive approximation analog-to-digital converter of the present invention. Different from the previous embodiment, in this embodiment, the switch for transmitting the sampling signal is not integrated in the D/A conversion circuit; as described, the successive approximation analog-to-digital converter comprises the first switch S1, and the first terminal of the first switch receives the sampling signal, and the second terminal and the output terminal of the D/A conversion circuit are connected to the same node, and the node is coupled to the first input terminal of the comparator; before the comparator performs the comparison, the first switch is turned on, and the sampling signal is transmitted to the first input terminal of the comparator; after that, the first switch is turned off, and the comparator performs the first comparison according to the sampling signal and the signal of the reference ground terminal. It needs to explain that when the first switch is turned on, the sampling signal Vin is transmitted to the second terminal of the unit capacitor and the capacitor array in the D/A conversion circuit, the voltages of the second terminal of all capacitors are VIN, and the D/A conversion circuit performs calculation on the sampling signal VIN and the reference voltage signal Vref to regulate the magnitude of the first voltage signal.

Figure 3:
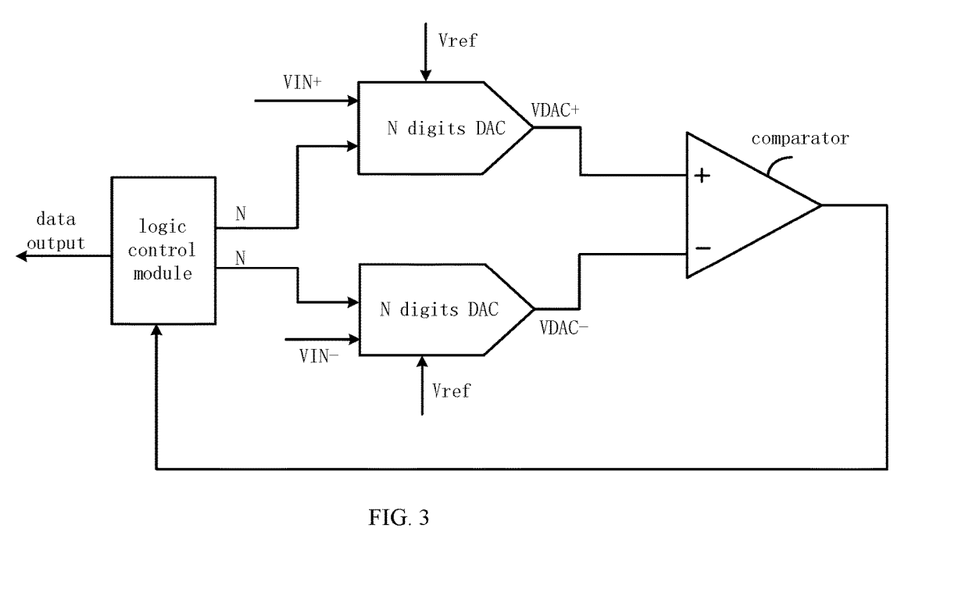
FIG. 3 is a schematic block diagram of a third embodiment of a successive approximation analog-to-digital converter of the present invention.

Refer to FIG. 3, it is a schematic block diagram of the third embodiment of the successive approximation analog-to-digital converter of the present invention. In the embodiment of the invention, the successive approximation analog-to-digital converter comprises a D/A conversion circuit, a comparator, and a logic control module; the input signal is sampled and held to obtain a sampling signal; the D/A conversion circuit receives the sampling signal and the reference voltage signal, and its output terminal outputs the first voltage signal; the output terminal of the D/A conversion circuit is coupled to at least one input terminal of the comparator. In this embodiment, the D/A conversion circuit comprises two sub D/A conversion circuits, and the circuit structures of the two sub D/A conversion circuits are the same, both are like the D/A conversion circuits in FIG. 4. The sampling signal comprises a first sampling signal and a second sampling signal, e.g., VIN+ and VIN−. Before the comparator performs the comparison, the first sampling signal VIN+ and the second sampling signal VIN− are respectively transmitted to the first input terminal and the second input terminal of the comparator; after that, the transmission of the first sampling signal and the second sampling signal to the input terminal of the comparator is disconnected, and the comparator performs the first comparison according to the first sampling signal and the second sampling signal. The two sub D/A conversion circuits respectively receive the first sampling signal and the second sampling signal and output the first voltage signal and the second voltage signal, e.g., $V_{DAC+}$ and $V_{DAC-}$, and the first voltage signal and the second voltage signal are respectively transmitted to the first input terminal and the second input terminal of the comparator; after the comparator performs the first comparison, the second and the subsequent comparisons, the comparator makes the comparison according to the first voltage signal and the second voltage signal. In this embodiment, the two sub D/A conversion circuits and the D/A conversion circuit are of the same structure, and capacitor arrangement, the capacitance values and capacitor switch manners in its capacitor array are all the same as that in embodiment one.

In an embodiment, each sub D/A conversion circuit comprises a third switch, and the first terminal of two corresponding third switches receive the first sampling signal and the second sampling signal respectively, and the second terminal of the two third switches correspondingly is connected to the common connection terminal of the D/A conversion circuit; before the comparator performs the comparison, the third switch is turned on, and the first sampling signal is transmitted to an input terminal of the comparator and the second terminal of the unit capacitor and the capacitor array, e.g., the first sampling signal is transmitted to the first input terminal of the comparator and the common connection terminal of one sub D/A conversion circuit; the second sampling signal is transmitted to the second input terminal of the comparator and the common connection terminal of another sub D/A conversion circuit, and the comparator performs the first comparison according to the first sampling signal and the second sampling signal. Here, the two sub D/A conversion circuits comprise two third switches, and the first terminal of each third switch receives the first sampling signal and the second sampling signal respectively; when the third switch is turned on, the sampling signal is transmitted to the unit capacitor and the second terminal of the capacitor array, e.g., wherein the voltage of the second terminal of all capacitors in one of the sub D/A conversion circuits is all VIN+, and the voltage of the second terminal of all the capacitors in another sub D/A conversion circuit is all VIN−.

In another embodiment, the successive approximation analog-to-digital converter comprises a fourth switch and a fifth switch. The first terminal of the fourth switch receives the first sampling signal VIN+, and the second terminal and the output terminal of one of the sub D/A conversion circuit are connected to the same node, and the node is coupled to the first input terminal of the comparator; the first terminal of the fifth switch receives the second sampling signal VIN−, and the second terminal and the output terminal of another sub D/A conversion circuit are connected to the same node, and the node is coupled to the second input terminal of the comparator; before the comparator performs the comparison, the fourth switch and the fifth switch are turned on, and the first sampling signal VIN+ and the second sampling signal VIN− are transmitted to the first input terminal and the second input terminal of the comparator; after the comparator performs the first comparison according to the first sampling signal and the second sampling signal, the fourth switch and the fifth switch are turned off.

According to the circuit structure of FIG. 3, if the comparator first compares the positive voltage, e.g., VIN+, and a negative voltage, e.g., VIN−, if the VIN+ is greater than VIN−, then the comparator outputs high level effective signal, and the signal output from the feedback output terminal of the logic control module controls the single-pole double-throw switch S1 in the first D/A converter to be switched from the connection terminal of the reference voltage signal to the reference ground terminal, and meanwhile controls the single-pole double-throw switch S1' in the second D/A converter to be switched from the reference ground terminal to the connection terminal of the reference voltage signal, at this time, the magnitude of the first voltage signal output from the output terminal of the first sub D/A conversion circuit is VIN+−8/32Vref, and the magnitude of the second voltage signal output from the output terminal of the first sub D/A conversion circuit is VIN−+8/32Vref; otherwise, if VIN+ is less than VIN−, the comparator outputs low level effective signal, and the first voltage signal output from the output terminal of the first sub D/A conversion circuit is adjusted up; the second voltage signal output from the output terminal of the D/A conversion circuit is adjusted down; after that, the comparator performs further comparison according to the first voltage signal and the second voltage signal, and the D/A conversion circuit continues to regulate the magnitude of the first voltage signal and the second voltage signal by the above rules according to the comparison results, until the number of times of comparison achieves the preset digits of the D/A conversion circuit, and the data generated by the logic control module is output as the data of the analog-to-digital converter.

As for that the input signal is a differential signal in this embodiment, it accurately accomplishes the conversion and output of the data signal of the input signal. Moreover, there is no need to provide a common mode voltage, and simplifies the circuit structure and design difficulty.

Figure 5:
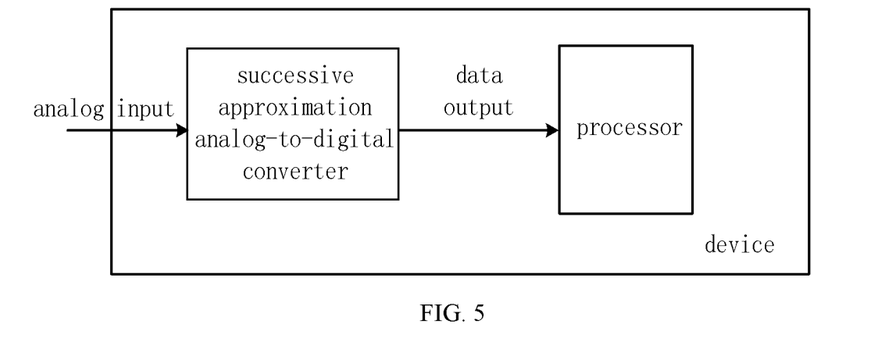
FIG. 5 is a device applying the successive approximation analog-to-digital converter of the present invention.

Finally, refer to FIG. 5, the present invention embodiment discloses a device, the above successive approximation analog-to-digital converter and the processor; the processor is coupled to the data output terminal of the successive approximation analog-to-digital converter to receive the data signal, and the processor performs logic calculation on the data signals to transmit them to the subsequent levels of circuits to perform the application.

Wherein, the processor may be a circuit or an assembly that can perform logic calculation. In some embodiments, the processor is a field programmable gate array, ASIC, or state machine. For example, a processor can receive data signals and perform logical calculations or various applications based on the received data signals. The subsequent circuits of the processor can be an analog-to-digital converter, a display, or an upper computer, a control unit, etc. The device including the analog-to-digital converter of the present application can display the magnitude of the analog signal input voltage, current, and temperature to the upper computer, and can also provide the chip with data signals to perform logical control to achieve the effect of protecting the chip.

Similarly, the device of the present invention can be a switching power supply device, a communication device, or other devices that require an analog-to-digital converter. The device of this embodiment also has the beneficial effect of low design difficulty and high device accuracy.

It should be noted that as for "valid" and "invalid" mentioned in this article, may, in one embodiment, valid corresponds to high level while invalid corresponds to low level; in another embodiment, it may also be that valid corresponds to low level while invalid corresponds to high level.

Though the embodiments are described and explained separately above, some common technologies can be replaced and integrated among the embodiments in the opinion by those of ordinary skill in the art. For contents not explicitly described in one embodiment, reference can be made to other described embodiment.

The above described embodiments do not form restriction on the protection scopes of the technical solutions. Any modifications, equivalent replacements, and improvements made within the spirit and principles of the above implementations shall be included in the protection scope of the technical solution.

What is claimed is:

1. A successive approximation analog-to-digital converter, comprising a D/A conversion circuit, a comparator, and a logic control module, wherein
an input signal is sampled and held to obtain a sampling signal; the D/A conversion circuit receives the sampling signal and a reference voltage signal, and an output terminal of the D/A conversion circuit outputs a first voltage signal; the output terminal of the D/A conversion circuit is coupled to at least one input terminal of the comparator,
an output terminal of the comparator is coupled to an input terminal of the logic control module, and the logic control module controls the D/A conversion circuit to adjust the first voltage signal according to a comparison result of the comparator, and
when a number of comparison of the comparator reaches preset digits of the D/A conversion circuit, a data output terminal of the logic control module outputs a data signal corresponding to the input signal,
wherein the D/A conversion circuit comprises a unit capacitor and a capacitor array, wherein
a first terminal of the unit capacitor is connected to a reference ground terminal or to a connection terminal of the reference voltage signal through a single-pole double-throw switch,
the capacitor array comprises a plurality of capacitor banks, wherein each capacitor bank of the plurality of capacitor banks comprises two capacitors with equal capacitance values, and a first terminal of each capacitor in the capacitor array is switched to the reference ground terminal or to the connection terminal of the reference voltage signal through the single-pole double-throw switch connected in serial with the capacitor; at an initial moment, the first terminal of a first capacitor of the two capacitors in each capacitor bank is connected to the connection terminal of the reference voltage signal through the single-pole double-throw switch, and the first terminal of a second capacitor of the two capacitors in each capacitor bank is connected to the reference ground terminal through the single-pole double-throw switch, and
second terminals of the unit capacitor and the capacitor array are connected together to form a common connection terminal as the output terminal of the D/A conversion circuit.

2. The successive approximation analog-to-digital converter of claim 1, wherein the D/A conversion circuit adjusts the first voltage signal up or down according to the comparison result.

3. The successive approximation analog-to-digital converter of claim 1, wherein a capacitance value of the unit capacitor is used as a unit capacitance value, and each group of capacitance values of the plurality of capacitor banks are arranged in a binary or thermometer code manner based on the unit capacitance value.

4. The successive approximation analog-to-digital converter of claim 1, wherein the reference ground terminal or the connection terminal of the reference voltage signal is switched starting from a capacitor bank with a largest capacitance value according to the comparison result of the comparator.

5. The successive approximation analog-to-digital converter of claim 1, wherein,
before the comparator performs the comparison, the sampling signal is transmitted to a first input terminal of the comparator and the common connection terminal; and
a second input terminal of the comparator is connected to the reference ground terminal, and the comparator performs a first comparison according to the sampling signal and a voltage of the reference ground terminal.

6. The successive approximation analog-to-digital converter of claim 5, wherein the D/A conversion circuit comprises a second switch, wherein a first terminal of the second switch receives the sampling signal, and a second terminal of the second switch is connected to the common connection terminal, and
the second switch is turned on before the comparator performs the comparison, and the sampling signal is transmitted to the first input terminal of the comparator and the second terminals of the unit capacitor and the capacitor array; then, the second switch is turned off, and the comparator performs the first comparison according to the sampling signal and a signal of the reference ground terminal.

7. The successive approximation analog-to-digital converter of claim 5, further comprising a first switch, wherein a first terminal of the first switch receives the sampling signal, a second terminal of the first switch and the output terminal of the D/A conversion circuit are connected to a same node, and the same node is coupled to the first input terminal of the comparator, and
before the comparator performs the comparison, the first switch is turned on, and the sampling signal is transmitted to the first input terminal of the comparator and the second terminals of the unit capacitor and the capacitor array; then the first switch is turned off, and the comparator performs the first comparison according to the sampling signal and a signal of the reference ground terminal.

8. The successive approximation analog-to-digital converter of claim 5, wherein a range value of the successive approximation analog-to-digital converter is consistent with a value of the reference voltage signal, and a scope of the range value of the successive approximation analog-to-digital converter is from subtracting one half of a voltage of the reference voltage signal from the voltage of the reference ground terminal to adding one half of the voltage of the reference voltage signal to the voltage of the reference ground terminal.

9. The successive approximation analog-to-digital converter of claim 8, wherein a voltage value of the reference ground terminal is zero voltage.

10. The successive approximation analog-to-digital converter of claim 1, wherein,
the sampling signal comprises a first sampling signal and a second sampling signal, wherein before the comparator performs the comparison, the first sampling signal and the second sampling signal are respectively transmitted to the first input terminal and the second input terminal of the comparator,
the comparator performs the first comparison according to the first sampling signal and the second sampling signal, and
the D/A conversion circuit comprises two sub D/A conversion circuits, wherein the two sub D/A conversion circuits are configured to receive the first sampling signal and the second sampling signal respectively and output a first voltage signal and a second voltage signal, and the first voltage signal and the second voltage signal are respectively transmitted to the first input terminal and the second input terminal of the comparator.

11. The successive approximation analog-to-digital converter of claim 10, wherein,
circuit structures of the two sub D/A conversion circuits are same, each of the two sub D/A conversion circuits comprises a third switch, first terminals of the two third switches respectively receive the first sampling signal and the second sampling signal, and second terminals of the two third switches are correspondingly connected to the common connection terminal of the D/A conversion circuit, and
before the comparator performs the comparison, the two third switches are turned on, and the first sampling signal and the second sampling signal are transmitted to the first input terminal and the second input terminal of the comparator, and the first sampling signal and the second sampling signal are correspondingly transmitted to the second terminals of the unit capacitor and the capacitor array of the D/A conversion circuit; then the two third switches are turned off, and the comparator performs the first comparison according to the first sampling signal and the second sampling signal.

12. The successive approximation analog-to-digital converter of claim 10, wherein,
circuit structures of the two sub D/A conversion circuits are same, and the successive approximation analog-to-digital converter comprises a fourth switch and a fifth switch; a first terminal of the fourth switch receives the first sampling signal, and a second terminal of the fourth switch and the output terminal of one sub D/A conversion circuit of the D/A conversion circuit are connected to a first same node, wherein the first same node is coupled to the first input terminal of the comparator,
a first terminal of the fifth switch receives the second sampling signal, and a second terminal of the fifth switch and the output terminal of another sub D/A conversion circuit of the D/A conversion circuit are connected to a second same node, wherein the second same node is coupled to the second input terminal of the comparator, and
before the comparator performs the comparison, the fourth switch and the fifth switch are turned on, the first sampling signal and the second sampling signal are transmitted to the first input terminal and the second input terminal of the comparator; then the fourth switch and the fifth switch are turned off, and the comparator performs the first comparison according to the first sampling signal and the second sampling signal.

13. The successive approximation analog-to-digital converter of claim 10, wherein a range value of the successive approximation analog-to-digital converter is consistent with a value of the reference voltage signal, and a scope of the range value of the successive approximation analog-to-digital converter is from negative ½ to positive ½ of the value of the reference voltage signal.

14. A device, comprising the successive approximation analog-to-digital converter of claim 1 and a processor, wherein
the processor is coupled to the data output terminal of the successive approximation analog-to-digital converter to receive the data signal, and the processor performs logic calculation on the data signal to transmit the data signal to subsequent stages of circuits to perform applications.

15. A successive approximation analog-to-digital conversion method, comprising:
sampling and holding an input signal to obtain a sampling signal,
receiving the sampling signal and a reference voltage signal by a D/A conversion circuit, and outputting a first voltage signal, wherein the first voltage signal is transmitted to an input terminal of a comparator, and a comparison result of the comparator is received by a logic control module to control the D/A conversion circuit to perform adjustment on the first voltage signal, and
when a number of comparison of the comparator achieves preset digits of the D/A conversion circuit, outputting a data signal corresponding to the input signal by a data output terminal of the logic control module,
wherein the first voltage signal is obtained by addition or subtraction of the sampling signal and the reference voltage signal.

16. The successive approximation analog-to-digital conversion method of claim 15, wherein the D/A conversion circuit adjusts the first voltage signal up or down according to the comparison result.

17. The successive approximation analog-to-digital conversion method of claim 15, wherein the sampling signal is transmitted to a first input terminal of the comparator, a second input terminal of the comparator is connected to the reference ground terminal, and the comparator performs a first comparison according to the sampling signal and a voltage of the reference ground terminal,
the comparator performs second and subsequent comparisons according to the first voltage signal and the voltage of the reference ground terminal, and
a range value of the successive approximation analog-to-digital converter is consistent with a value of the reference voltage signal, and a scope of the range value of the successive approximation analog-to-digital converter is from subtracting one half of a voltage of the reference voltage signal from the voltage of the reference ground terminal to adding one half of the voltage of the reference voltage signal to the voltage of the reference ground terminal.

18. The successive approximation analog-to-digital conversion method of claim 15, wherein the sampling signal comprises a first sampling signal and a second sampling signal, wherein before the comparator performs the comparison, the first sampling signal and the second sampling signal are respectively transmitted to the first input terminal and the second input terminal of the comparator,
  the comparator performs a first comparison according to the first sampling signal and the second sampling signal,
  the D/A conversion circuit comprises two sub D/A conversion circuits, wherein the two sub D/A conversion circuits are configured to receive the first sampling signal and the second sampling signal respectively and output the first voltage signal and a second voltage signal, and the first voltage signal and the second voltage signal are respectively transmitted to the first input terminal and the second input terminal of the comparator,
  the comparator performs second and subsequent comparisons according to the first voltage signal and the second voltage signal, and
  a range value of the successive approximation analog-to-digital converter is consistent with a value of the reference voltage signal, and a scope of the range value of the successive approximation analog-to-digital converter is from negative ½ to positive ½ of the value of the reference voltage signal.

19. A successive approximation analog-to-digital conversion method, comprising:
  sampling and holding an input signal to obtain a sampling signal,
  receiving the sampling signal and a reference voltage signal by a D/A conversion circuit, and outputting a first voltage signal, wherein the first voltage signal is transmitted to an input terminal of a comparator, and a comparison result of the comparator is received by a logic control module to control the D/A conversion circuit to perform adjustment on the first voltage signal, and
  when a number of comparison of the comparator achieves preset digits of the D/A conversion circuit, outputting a data signal corresponding to the input signal by a data output terminal of the logic control module,
  wherein the D/A conversion circuit comprises a capacitor array formed of a unit capacitor and a plurality of capacitor banks, wherein each capacitor bank of the plurality of capacitor banks comprises two capacitors with equal capacitance values; and
  first terminals of the unit capacitor and each capacitor of the capacitor array are connected to a reference ground terminal or to a connection terminal of the reference voltage signal through a single-pole double-throw switch, and second terminals of the unit capacitor and each capacitor of the capacitor array are connected together as an output terminal of the D/A conversion circuit.

* * * * *